US009547282B2

(12) United States Patent
Chen et al.

(10) Patent No.: US 9,547,282 B2
(45) Date of Patent: Jan. 17, 2017

(54) WEARABLE DEVICE WITH WIRELESS TRANSMISSION AND METHOD FOR MANUFACTURING THE SAME

(71) Applicant: HTC Corporation, Taoyuan (TW)

(72) Inventors: Chien-Chih Chen, Taoyuan (TW); Yen-Liang Kuo, Taoyuan (TW); Keng-Chih Lin, Taoyuan (TW); Chien-Ting Ho, Taoyuan (TW); Chien-Lung Huang, Taoyuan (TW); Sheng-Chieh Lin, Taoyuan (TW); Chung Ju Wu, Taoyuan (TW); Pin-Chung Sun, Taoyuan (TW); Yao-Ting Tseng, Taoyuan (TW)

(73) Assignee: HTC Corporation, Taoyuan (TW)

( * ) Notice: Subject to any disclaimer, the term of this patent is extended or adjusted under 35 U.S.C. 154(b) by 259 days.

(21) Appl. No.: 14/593,285

(22) Filed: Jan. 9, 2015

(65) Prior Publication Data

US 2016/0202668 A1 Jul. 14, 2016

(51) Int. Cl.

| | |
|---|---|
| ***H05K 7/00*** | (2006.01) |
| ***H05K 5/00*** | (2006.01) |
| ***G04G 21/04*** | (2013.01) |
| ***G04G 17/04*** | (2006.01) |
| ***G04G 17/08*** | (2006.01) |

(52) U.S. Cl.

CPC .............. *G04G 21/04* (2013.01); *G04G 17/04* (2013.01); *G04G 17/08* (2013.01)

(58) Field of Classification Search

CPC ........................................................ H01Q 7/00
USPC ..................................................... 361/679.21
See application file for complete search history.

(56) References Cited

U.S. PATENT DOCUMENTS

| | | | | |
|---|---|---|---|---|
| 2004/0264119 | A1* | 12/2004 | Hirota | G06F 1/1616 361/679.55 |
| 2014/0043248 | A1* | 2/2014 | Yeh | H01Q 7/00 345/173 |

FOREIGN PATENT DOCUMENTS

| | | | |
|---|---|---|---|
| TW | 201414075 | A | 4/2014 |
| TW | 201438342 | A | 10/2014 |
| TW | 201444443 | A | 11/2014 |
| TW | 201501416 | A | 1/2015 |

OTHER PUBLICATIONS

Office Action from Taiwanese Patent & Trademark Office, in the Taiwanese counterpart application No. TW 104100806 in Chinese.

* cited by examiner

*Primary Examiner* — Jerry Wu
(74) *Attorney, Agent, or Firm* — Juan Carlos Marquez; Marquez IP Law Office, PLLC

(57) ABSTRACT

The present invention provides a wearable device with wireless transmission. The wearable device includes: a first exterior member configured to operate at a first frequency band; a second exterior member configured to operate at a second frequency; and a connecting member configured to electrically insulate the first exterior member from the second exterior member, so the wearable device is able to operate at the first frequency band and the second frequency band simultaneously. A frame structure of the wearable device is formed by stacking the first exterior member, the connecting member and the second exterior member in sequence from top to bottom. In addition, a method for manufacturing the same is also provided in the present invention.

22 Claims, 12 Drawing Sheets

10

WEARABLE DEVICE WITH WIRELESS TRANSMISSION AND METHOD FOR MANUFACTURING THE SAME

BACKGROUND OF THE INVENTION

1. Field of the Invention

The present invention relates to the fields of structure design and wireless transmission, and more particularly, relates to a wearable device with wireless transmission.

2. the Prior Arts

As electronic technology advances, it has become a trend nowadays to use smart phones and tablets instead of personal computers. The popularization of smart phones not only promotes the development of software application (commonly known as APPs), but also creates an enormous market and great business opportunities for related accessories. On the other hand, "wearable devices" have also become popular on the market today, and people are starting to wear such wearable devices instead of common watches. These wearable devices not only provide the functions of common watches, but are also equipped with the function of global positioning system (GPS) or Wi-Fi transmission integrated with the antenna system.

Limited by the structure and size of the wearable device, the wearable devices with antenna that are available on the market nowadays usually utilize a part of its housing to be the antenna, such as a bezel structure. Generally speaking, bezel structures can be divided into two categories. FIG. 1 is a schematic view showing a bezel being a single piece of metal member with a single layered structure. As shown in FIG. 1, the wearable device 1 includes a bezel structure 10, a metal member 11 and a printed circuit board (PCB) 12. Although the bezel structure 10 is a single metal piece that has a high structural strength, the signal quality and efficiency of the antenna is still low due to the electrical connection between the metal member 11 and the PCB 12 necessitated by grounding, and also due to the direct connection between the bezel structure 10 and the metal member 11. FIG. 2 is a schematic view illustrating an exterior bezel structure 21, which is integrated by a metal and a plastic structure 22, having a double layered structure. As shown in FIG. 2, wearable device 2 includes a metal member 24, a plastic structure 22 and a PCB 23. Such wearable device 2 is advantageous in that because of the assembling method of the wearable device 2, to be more specific, because of the separation between the metal member 24 and the exterior bezel structure 21 by the plastic structure 22, the antenna signal strength is not compromised; however, the overall structural strength of such wearable device 2 is relatively low because part of the housing is made of plastic material, and the exterior bezel structure is likely to be separated with the plastic structure 22.

Due to the above reasons, for the sake of the wearable device, it is preferable to inject plastic material at the region between the exterior member (such as bezel structures) and the internal metal member with insert molding technique to separate the two metal members without compromising the overall structural strength of the wearable device. In such a way, not only is the overall structural strength of the wearable device maintained, the interference against the antenna signal by the metal members can also be reduced. Therefore, it is a pressing matter for the industry to develop such a device to maintain a good signal quality and good efficiency of the antenna.

Additionally, in conventional insert molding processes, metal members (such as aluminum ingots) are usually embedded first for the injection molding to form a workpiece. Subsequently, computer numerical control (CNC) machining is utilized to form the outer appearance of the workpiece. Finally, the workpiece undergoes appearance finishing process to become the final product. Nevertheless, the process as described above may cause dust or moist to enter the final product during the manufacturing process, thus lowering the product yield or degrading the performance of the final product.

Hence, there is a need for the industry to develop an insert molding process in which the appearance finishing treatment is performed first before the embedding of the insert molding process. In such a way, once the insert molding process is finished, the exterior members are connected with the internal metal members, thereby forming the final product.

SUMMARY OF THE INVENTION

Based on the above reasons, a primary objective of the present invention is to provide a wearable device with wireless transmission. The wearable device at least includes: a first exterior member configured to operate at a first frequency band; a second exterior member configured to operate at a second frequency; and a connecting member configured to electrically insulate the first exterior member from the second exterior member, so the wearable device is able to operate at the first frequency band and the second frequency band simultaneously. A frame structure of the wearable device is formed by stacking the first exterior member, the connecting member and the second exterior member in sequence from top to bottom.

According to an embodiment of the present invention, the wearable device with wireless transmission of the present invention further includes a back cover. The back cover is fastened to the connecting member via at least one fastening element, and a housing is formed by the frame structure and the back cover.

According to an embodiment of the present invention, the wearable device with wireless transmission of the present invention further includes a metal layer having a ground plane. The metal layer is printed on a printed circuit board or is independently disposed on a surface of the printed circuit board, and the metal layer is electrically connected to the first exterior member and the second exterior layer.

Preferably, when the metal layer is printed on the printed circuit board, the printed circuit board and the metal layer are both configured to be the ground plane.

Preferably, when the metal layer is independently disposed on the surface of the printed circuit board, the metal layer can be disposed on an upper surface or a lower surface of the printed circuit board, and the metal layer is electrically connected to the printed circuit board.

Preferably, the wearable device with wireless transmission of the present invention further includes; a first chip module and a second chip module. The first chip module is connected to a processor, and enables the wearable device to operate at the first frequency band via the first exterior member. The second chip module is connected to the processor, and enables the wearable device to operate at the second frequency band via the second exterior member.

Preferably, a distance between the first exterior member and the second exterior member in a third direction (a Z-axis direction) is less than 1 mm.

Preferably, the first exterior member is located above the metal layer and the second exterior member is located beneath the metal layer; alternatively, the first exterior member is located beneath the metal layer and the second exterior member is located above the metal layer.

Preferably, the first exterior member includes at least one first connecting point, and the second exterior member includes a plurality of second connecting points. The first exterior member is electrically connected to the ground plane via the at least one first connecting point, and the second exterior member is electrically connected to the ground plane via the plurality of second connecting points.

Preferably, one of the first connecting points or the second connecting points includes at least one adjustable element for adjusting a return loss of the first frequency band and/or the second frequency band.

Preferably, the first connecting points and the second connecting points include a plurality of feed points and a ground point.

Preferably, the adjustable element is a variable capacitor or a variable inductor.

Preferably, an antenna structure of the wearable device is formed by the first exterior member, the second exterior member and the metal layer.

Preferably, a display module and a battery are borne by the metal layer.

Preferably, the display module is a module with touch function.

Preferably, the metal layer, the first exterior layer and the second exterior layer are made of a conductor. The conductor can be one of the following: stainless steel, magnesium aluminum alloy, copper alloy, aluminum copper alloy or other metals with a good conductivity Preferably, the back cover can be a conductor or a nonconductor.

Preferably, when the back cover is a conductor, a plastic layer is disposed on the cover to insulate the back cover from the second exterior member.

Preferably, the nonconductor is one of the following: acrylic, PET, resin or other plastic materials.

Furthermore, the present invention further provides a manufacturing method for a wearable device with wireless transmission. The wearable device at least includes a metal layer, a first exterior member, a second exterior member and a connecting member. The manufacturing method comprises the following steps: processing a first exterior member and a second exterior member so as to form outer appearances thereof; forming a connecting member with plastic injection molding process, and connecting the first exterior member and the second exterior member with the connecting member to form a frame structure; embedding a metal layer inside the frame structure with insert molding process, wherein the first exterior member is electrically insulated from the second exterior member by the connecting member; and providing a back cover, integrating the back cover with the frame structure to form a housing of the wearable device.

Other purposes, advantages and innovative features of the present invention will be apparent to those skilled in the art by reading the detailed description in the following section, with reference to the attached drawings.

BRIEF DESCRIPTION OF THE DRAWINGS

The preferred embodiments of the present invention and the summary as described above will be apparent to those skilled in the art by reading the detailed description in the following section, with reference to the attached drawings. For the illustration purpose, each drawing is drawn according to the preferred embodiments of the present invention; however, it should be understood that the present invention is not limited to the exact configuration and device shown in the drawings.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
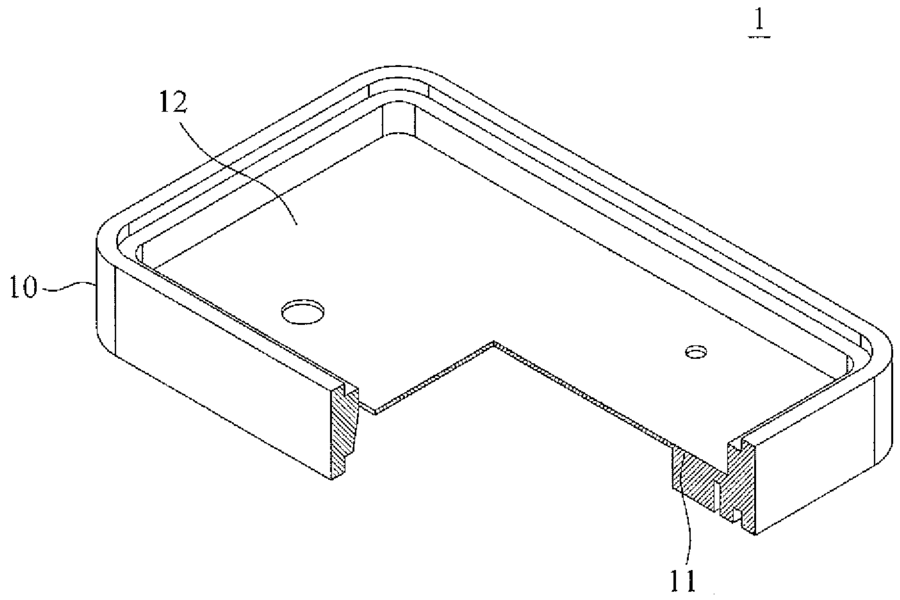
FIG. 1 (PRIOR ART)
FIG. 1 is a schematic view illustrating a conventional bezel having a single metal piece structure.
Figure 2:
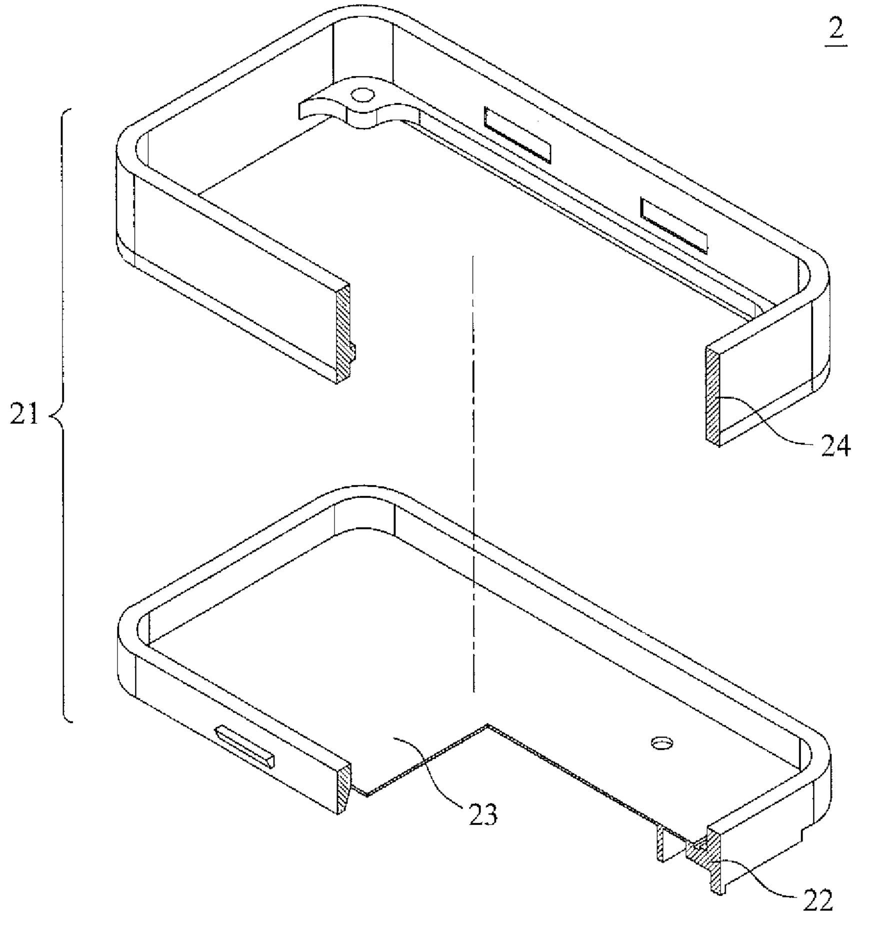
FIG. 2 (PRIOR ART)
FIG. 2 is a schematic view illustrating a conventional bezel, which is an integrated structure of a metal member and a plastic structure having a double layered structure.
Figure 3:
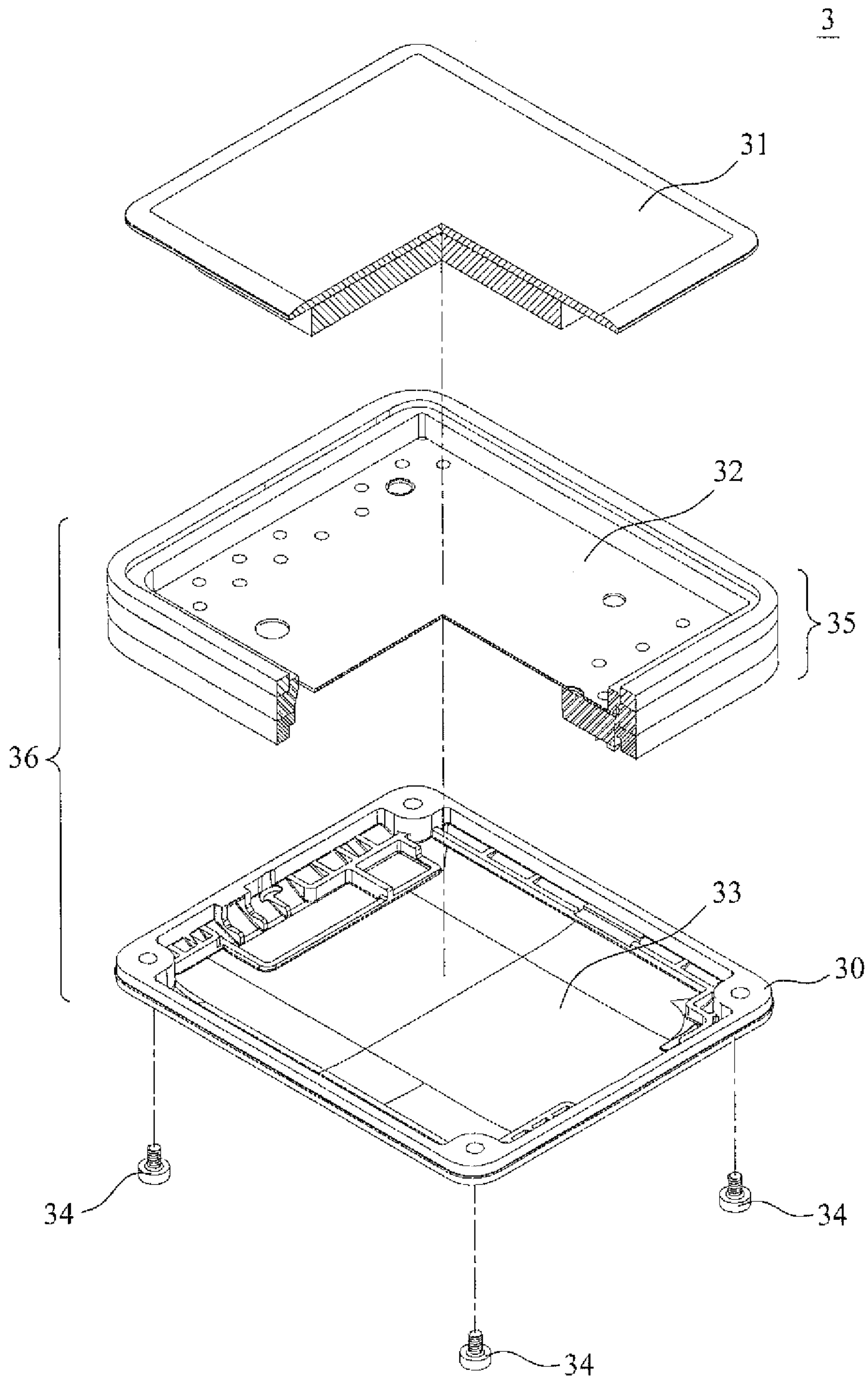
FIG. 3 is an exploded and perspective view showing the structure of a wearable device of the present invention.
Figure 4:
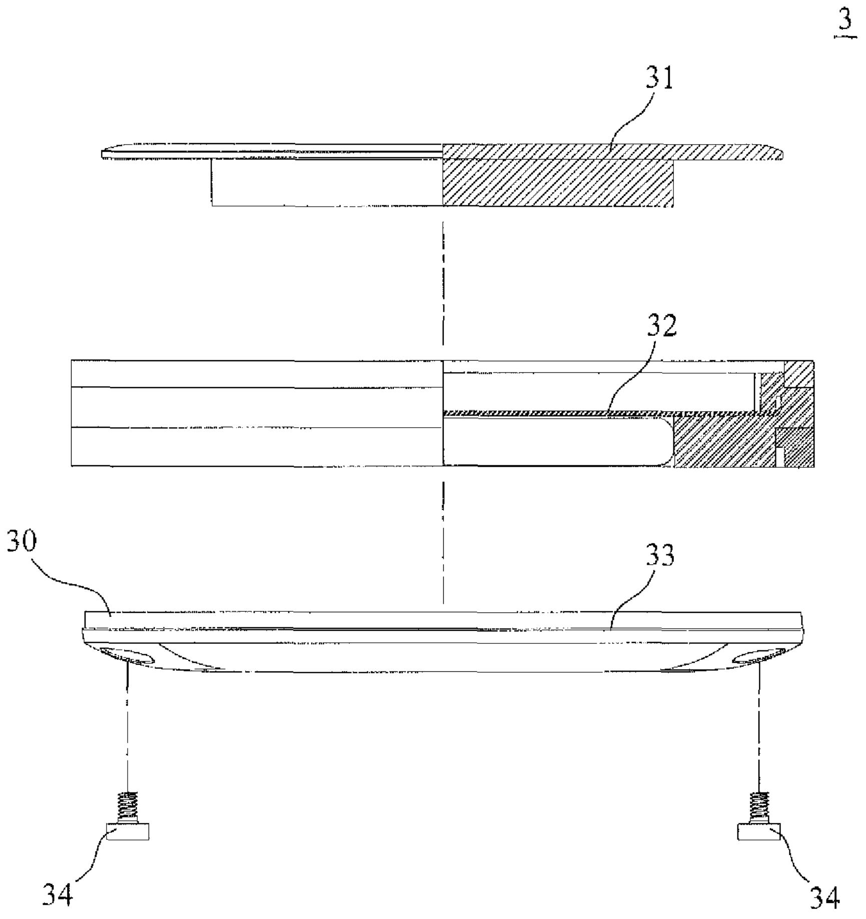
FIG. 4 is an exploded and partial cross section view showing the structure of the wearable device of the present invention.

FIG. 3 is an exploded and perspective view showing the structure of a wearable device of the present invention; FIG. 4 is an exploded and partial cross section view showing the stacking structure of the wearable device of the present invention. The structure of the wearable device of the present invention can be better understood when FIG. 3 and FIG. 4 are viewed together at the same time. The wearable device 3 of the present invention at least includes a display module 31 and a housing 36. The housing 36 consists of a frame structure 35 (i.e. a bezel structure) and a back cover 33.

The frame structure 35 of the wearable device may be composed of at least one exterior member (not shown in FIG. 3 & FIG. 4) and a connecting member (not shown in FIG. 3 & FIG. 4). The exterior member, which is made of a conductor, is configured to be the at least one antenna of the wearable device 3. On the other hand, the connecting member is made of a nonconductor such as a plastic material, but is not limited thereto. Detailed structure of the wearable device will be explained with reference to FIG. 5 and FIG. 6 later. Regarding the structure of the wearable device 3, the display module 31 and the metal layer 32 are electrically connected with each other so as to provide a display image. For the sake of operability and convenience, the display module 31 herein is configured to be a module with touch function. The metal layer 32 can be printed on a printed circuit board (PCB) (not shown), and can be considered as a ground plane of the wearable device 3. Alternatively, the metal layer 32 can be disposed independently above or beneath the PCB, and is electrically connected thereto to form the ground plane of the wearable device 3. Practically, the metal layer 32 with the independent configuration may increase the overall structural strength of the wearable device; regarding the stacking structure, the metal layer 32 can be used to support the display module 31 and the at least one battery (not shown). The back cover 33 can be fastened to the connecting member with at least one fastening element 34 so as to connect the back cover 33 to a part of the exterior member. Thus, a part of the housing of the wearable device 3 is formed while keeping the fastening elements 34 from contacting the display module 31, metal layer 32 and the exterior member. A plastic layer 30 can be disposed on a part of the back cover 33 where the exterior member is in contact therewith. The plastic layer 30, which is an annular structure, is configured to keep the back cover 33 from directly contacting the exterior member. In an embodiment of the present invention, when the material of the back cover 33 is a conductor, the plastic layer 30 is needed on the back cover 33 to electrically insulate the back cover 33 with the exterior member; in another embodiment of the present invention, when the material of the back cover 33 is a nonconductor such as acrylics, PET and resin, the plastic layer 30 is not needed.

Figure 5:
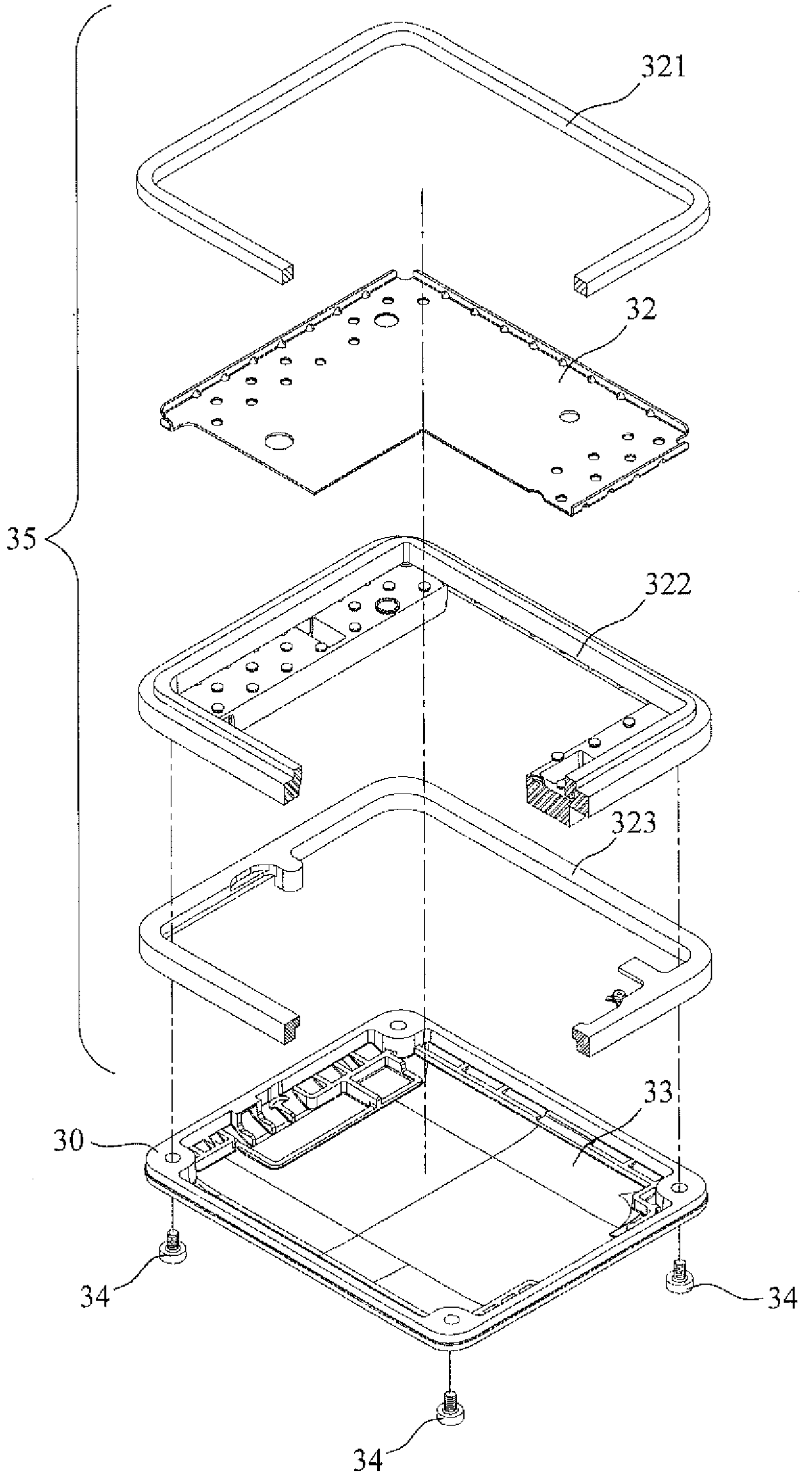
FIG. 5 is an exploded and perspective view showing the details of the wearable device of the present invention.
Figure 6:
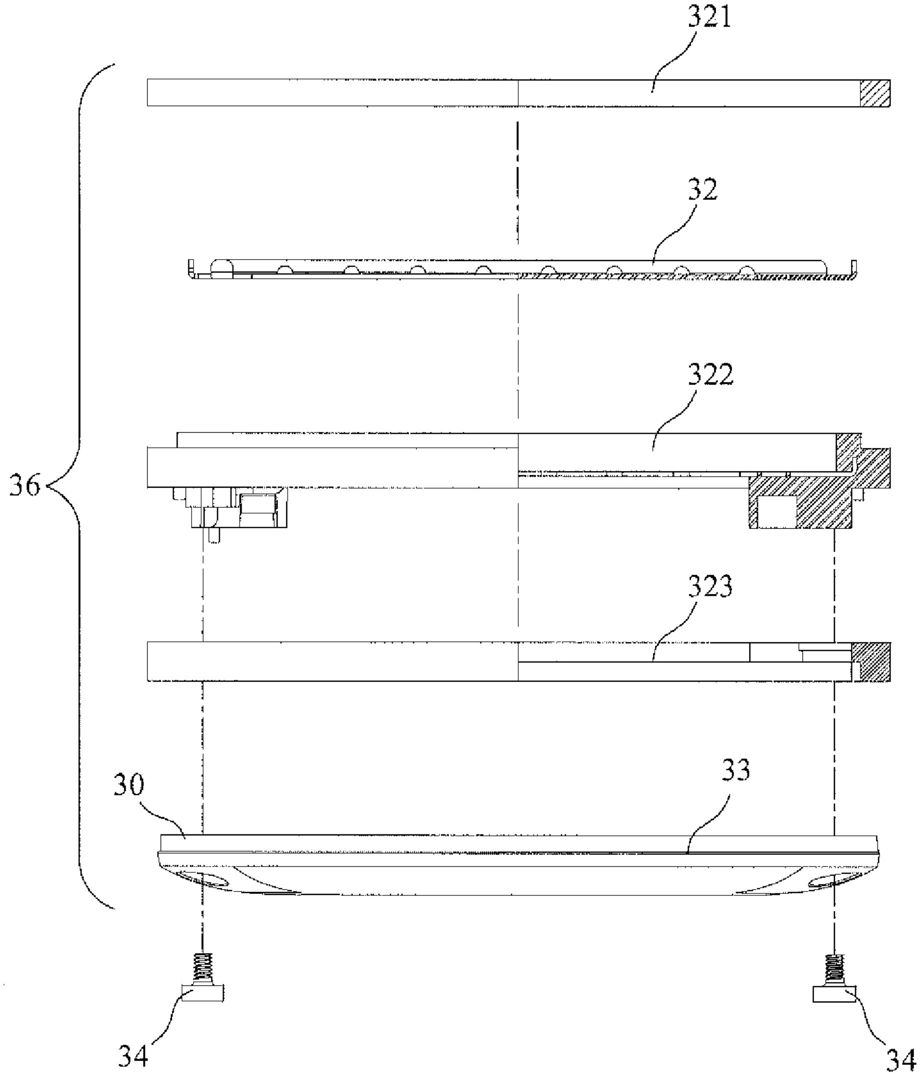
FIG. 6 is an exploded and partial cross section view showing the details of the wearable device of the present invention.

FIG. 5 is an exploded and perspective view showing the details of the frame structure of the present invention, and FIG. 6 is an exploded and partial cross section view showing the details of the stacking structure of the frame structure of the present invention. The structure of the frame structure of the present invention can be better understood when FIG. 5 and FIG. 6 are viewed together at the same time. As shown in FIG. 5 and FIG. 6, the frame structure 35 is formed by stacking an upper exterior metal member 321, a connecting member 322 and a lower exterior metal member 323 in sequence from top to bottom. In an embodiment of the present invention in which the wearable device is a watch, the frame structure 35 can be a bezel structure.

Hereafter, the detailed manufacturing method of the frame structure 35 of the present invention will be described. Before forming the connecting member 322 with the injection molding process, and before forming the metal layer 32 with the independent configuration with the insert molding process, the upper exterior metal member 321 and the lower exterior metal member 323 are processed and machined to form the outer appearances of the upper exterior metal member 321 and the lower exterior metal member 323. Additionally, in an embodiment of the present invention, the metal layer 32 is disposed on a PCB (not shown), and the PCB may be disposed on an upper surface or a lower surface of the metal layer 32. In another embodiment of the present invention, the PCB with the metal layer may undergo the insert molding process.

Once the outer appearances of the upper exterior metal member 321 and the lower exterior metal member 323 are formed, the connecting member 322 is formed by injecting plastic material between the two metal members. In such a way, the upper exterior metal member 321 and the lower exterior metal member 323 can be integrated with the connecting member 322 and thus becoming a single piece of exterior member (i.e. frame structure 35). At the same time, the metal layer 32 with the independent configuration is integrated with the frame structure 35 by the insert molding technique. Finally, a back cover 33 is provided and is assembled with the frame structure 35 to form a housing 36 of the wearable device.

With the plastic injection molding process and the insert molding process techniques, the upper exterior metal member 321 and the lower exterior metal member 323 are electrically insulated from each other. As a result, the shielding effect due to the all-metal antenna structure can be avoided, and the low signal strength of the antenna due to insufficient distance thereof can be improved. When the manufacturing process of the frame structure 35 is finished, the back cover 33 is fastened to the connecting member 322 via the fastening elements 34. Since the appearance finishing treatment is performed before the plastic injection molding process and the insert molding process, the present invention is able to integrate the exterior members and the internal metal members at the same time, so the final product is formed at the completion of the insert molding process. Furthermore, the manufacturing process provided by the present invention can effectively prevent dusts or moist from entering the wearable device during the manufacturing process, thereby improving the product yield and performance of the final product. Moreover, the upper exterior metal member 321, the lower exterior metal member 323 and the metal layer 32 with independent configuration of the present invention are integrally formed, and the conductive material used can be one of the following: stainless steel, magnesium aluminum alloy, copper alloy, aluminum copper alloy or other metals with a good conductivity.

Figure 7:
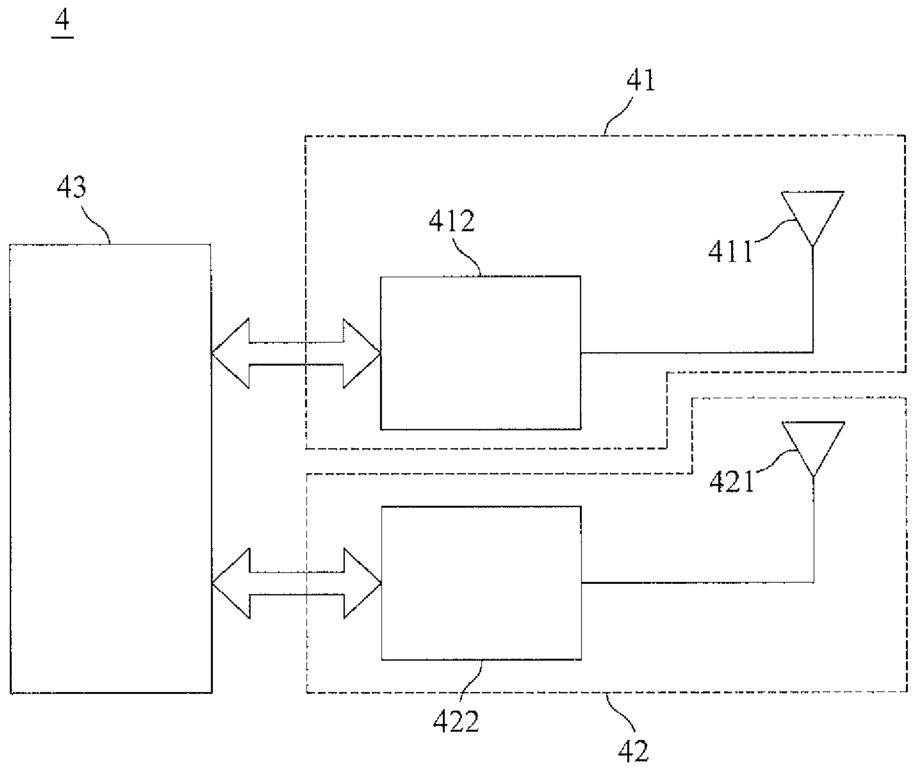
FIG. 7 is a block diagram illustrating the wireless transmission system according to a first embodiment of the present invention.
Figure 8:
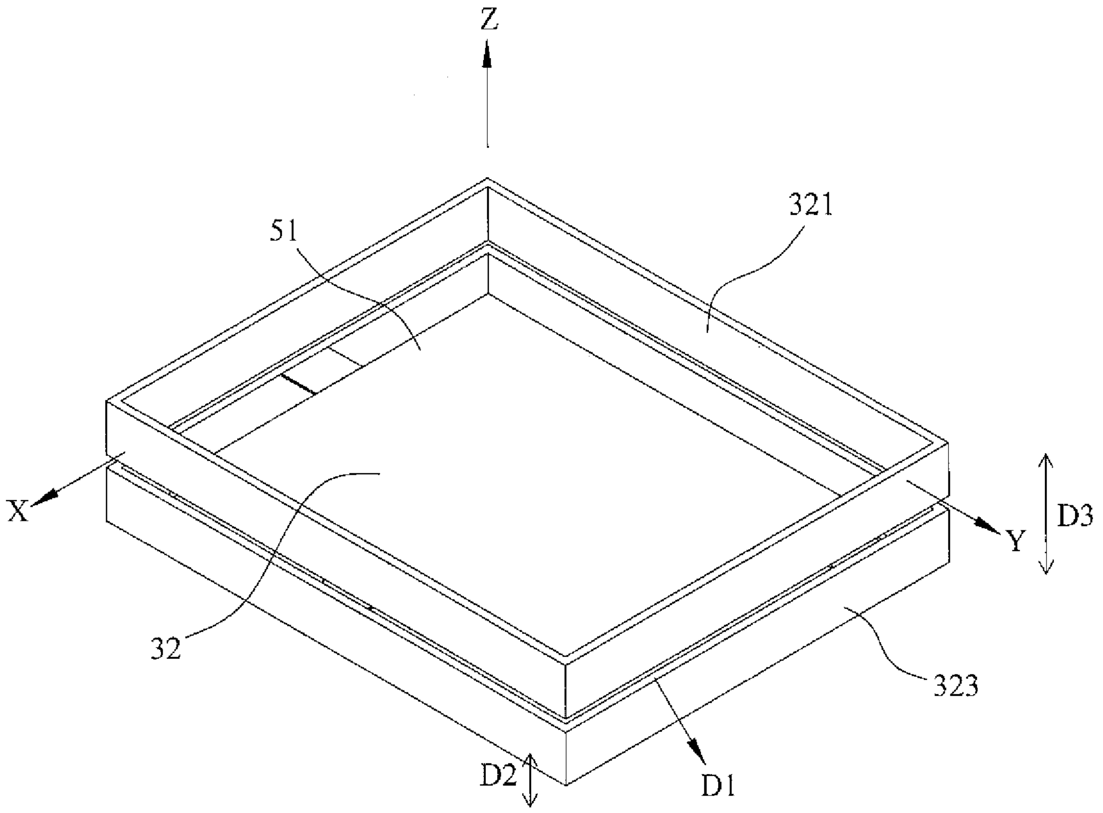
FIG. 8 is a perspective view showing the wireless transmission structure according to the first embodiment of the present invention.

FIG. 7 is a block diagram illustrating the wireless transmission system according to a first embodiment of the present invention, and FIG. 8 is a perspective view showing the wireless transmission structure according to the first embodiment of the present invention. As shown in FIG. 7 and FIG. 8, in the first embodiment of the present invention, a radiator of a wireless transmission system 4 is formed by the upper exterior metal member 321 and the lower exterior metal member 323. An actual distance D1 between the upper exterior metal member 321 and the lower exterior metal member 323 in a third direction (a Z-axis direction) is less than 1 mm; however, for the purpose of industrial design, D1 is set to 1 mm in the first embodiment of the present invention. In addition, a length D2, which is the length of the upper exterior metal member 321 and the length of the lower exterior metal member 323 in the third direction, is set to 4 mm in the first embodiment. As a result, a length D3, which is the total length of the frame structure 35 in the third direction, is 9 mm.

The wireless transmission system 4 has the function of wireless transmission, and is able operate at multiple radio frequency bands. The wireless transmission system 4 at least includes an antenna system 41 with a global positioning system (GPS) and an antenna system 42 with a Bluetooth/Wi-Fi (BT/Wi-Fi). The antenna system 41 includes a GPS antenna 411 and a GPS chip module 412. The antenna system 42 includes a BT/Wi-Fi antenna 421 and a BT/Wi-Fi chip module 422. In the first embodiment of the present invention, the upper exterior metal member 321 is the radiator of the GPS antenna 411, and the lower exterior metal member 323 is the radiator of the BT/Wi-Fi antenna 421; alternatively, the upper exterior metal member 321 may also be the radiator of the BT/Wi-Fi antenna 421, and the lower exterior metal member 323 may be the radiator of the GPS antenna 411 in other embodiments. It should be noted that, it is not mandatory for the upper exterior metal member 321 or the lower exterior metal member 323 to be exclusively suitable for GPS antenna 411 or the BT/Wi-Fi antenna 421. The antenna systems described above can operate at a first frequency band and a second frequency band. In the wireless transmission system 4, the GPS antenna 411 and the BT/Wi-Fi antenna 421 are respectively connected to a GPS chip module 412 and a BT/Wi-Fi chip module 422. The GPS chip module 412 is connected to a processor 43, and is able to receive a GPS signal. The BT/Wi-Fi chip module 422 is connected to the processor 43 as well, and is able to transcieve a BT/Wi-Fi signal. In the first embodiment of the present invention, the metal layer 32 is formed on a PCB 51, and the metal layer 32 (for example, formed by copper foil) and the PCB 51 are both configured to be the ground plane of the wireless transmission system 4. In another embodiment of the present invention, when the metal layer 32 is independently disposed on an upper surface or a lower surface of the PCB 51, a ground plane of the wireless transmission system 4 can also be formed due to the electrical connection between the metal layer 32 and the PCB 51. In the first embodiment of the present invention, the metal layer 32 is printed on the PCB 51, and the GPS chip module 412 and the BT/Wi-Fi chip module 422 are both disposed on the PCB 51. In the first embodiment of the present invention, the GPS antenna system 41 and the BT/Wi-Fi antenna system 42 of the wireless transmission system 4 can function simultaneously without flipping a switch (such as a RF switch, a SPDT switch, and etc.) between the GPS antenna system 41 and the BT/Wi-Fi antenna system 42.

Figure 9:
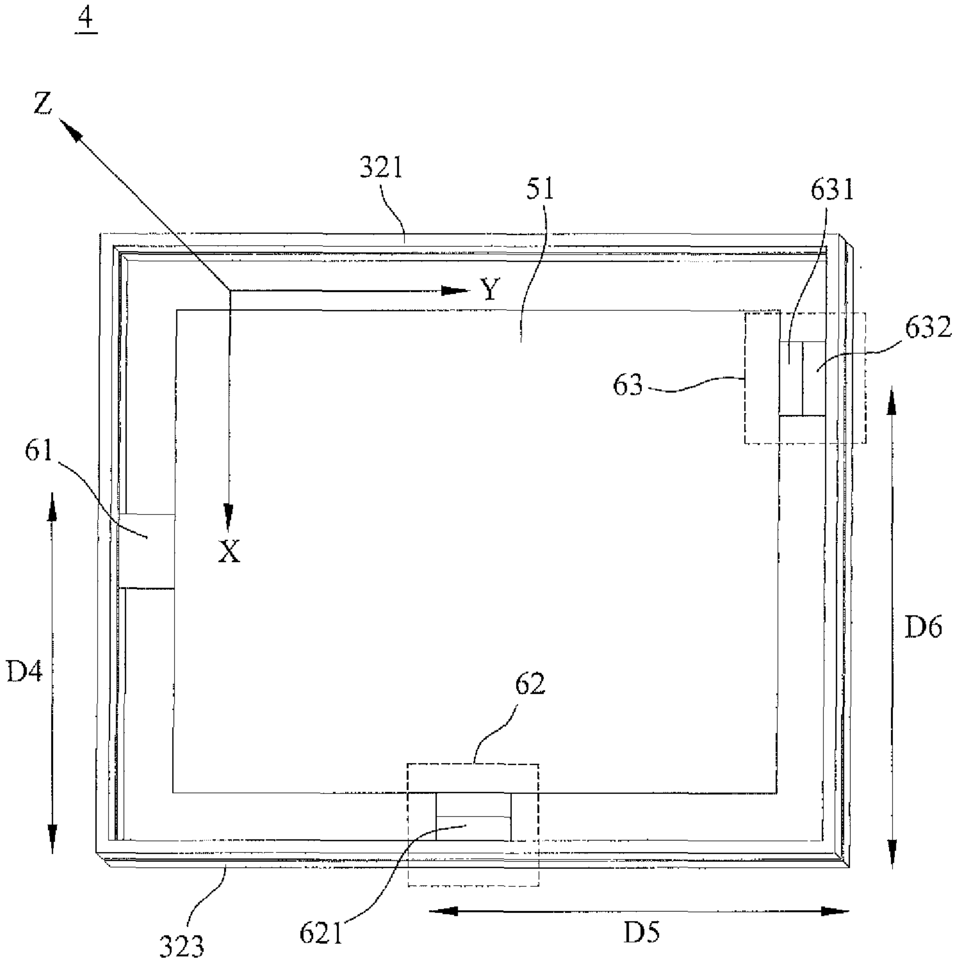
FIG. 9 is a top view showing the wireless transmission structure according to the first embodiment of the present invention.

FIG. 9 is a top view showing the structure of the wireless transmission system 4 according to the first embodiment of the present invention. As shown in FIG. 7, FIG. 8 and FIG. 9, the upper exterior metal member 321 has a first feed point 61, and the lower exterior metal member 323 has a second feed point 62 and a ground point 63. The upper exterior metal member 321 is electrically connected with the PCB 51 via the first feed point 61, and the upper exterior metal member 321 also constitutes a radiator of the GPS antenna 411. The lower exterior metal member 323 is electrically connected to the PCB 51 via the second feed point 62 and the ground point 63, and the lower exterior metal member 323 constitutes a radiator of the BT/Wi-Fi antenna 421. Since the upper exterior metal member 321 and the lower exterior metal member 323 are both electrically connected with the PCB 51, and the metal layer 32 is electrically connected to the PCB 51, it can be deduced that the upper exterior metal member 321 and the lower exterior metal member 323 are both electrically connected to the metal layer 32 as well. In addition, since the actual distance D1 between the upper exterior metal member 321 and the lower exterior metal member 323 in the third direction (the Z-axis direction) is less than 1 mm, the coupling effect between the upper exterior metal member 321 and the lower exterior metal member 323 is significant, thus lowering the effectiveness of the GPS antenna 411 and the BT/Wi-Fi antenna 421. Due to the above reasons, in order to enhance the operational effectiveness of the GPS antenna 411 and the BT/Wi-Fi antenna 421, it is preferable for the first embodiment of the present invention to arrange and to optimize the location of the connecting points (i.e. first feed point 61, second feed point 62 and ground point 63) in such a way that the coupling effect is eliminated.

In the first embodiment of the present invention, the first feed point 61 is disposed along a first direction (a X-axis direction) and is located at a location with a distance D4 from a first edge of the upper exterior metal member 321. The second feed point 62 is disposed along a second direction (a Y-axis direction) and is located at a location with a distance D5 from a second edge of the lower exterior metal member 323. The ground point 63 is also disposed along the first direction (the X-axis direction) and is located at a location with a distance D6 from a first edge of the lower exterior metal member 323. In the first embodiment of the present invention, D4 is set to 24 mm, D5 is set to 22 mm, and D6 is set to 41 mm. According to the above arrangements of the first feed point 61, the second feed point 62 and the ground point 63 in the first embodiment, the coupling effect between the GRS antenna 411 and the BT/Wi-Fi antenna 421 can be best eliminated. Furthermore, among the connecting points in the first feed point 61, the second feed point 62 and the ground point 63, at least one connecting point is electrically connected to the PCB 51 via an adjustable element. The at least one adjustable element can adjust the antenna gain of the GPS antenna 411 and the BT/Wi-Fi antenna 421. In the first embodiment of the present invention, a variable capacitor 621 is coupled between the second feed point 62 and the PCB 51, a variable capacitor 631 and a variable inductor 632 are coupled between the ground point 63 and the PCB 51. The variable capacitor 621, the variable capacitor 631 and the variable inductor 632 can adjust the antenna gain of the GPS antenna 411 and BT/Wi-Fi antenna 421.

Figure 10:
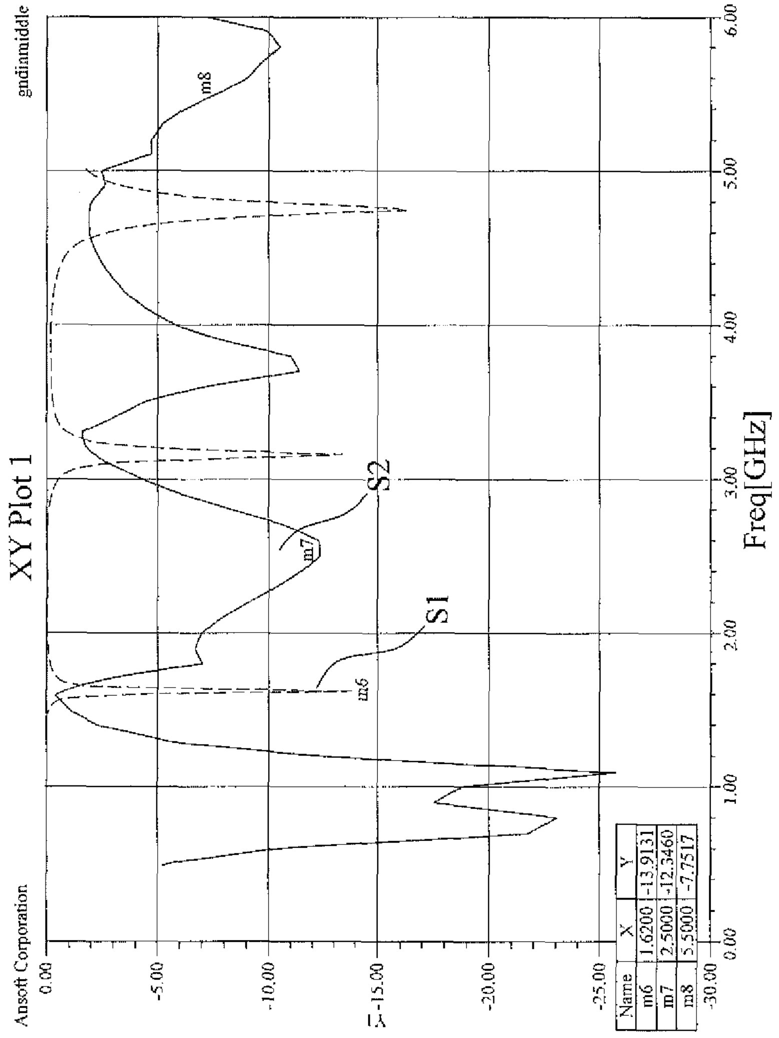
FIG. 10 is a X-Y plot showing the return loss of the wireless transmission system according to the first embodiment of the present invention.

FIG. 10 is a X-Y plot showing the return loss of the wireless transmission system according to the first embodiment of the present invention. As shown in FIG. 7 and FIG. 10, the return loss X-Y plot of FIG. 10 includes a GPS signal S1 of the GPS antenna system 41 and a BT/Wi-Fi signal S2 of the BT/Wi-Fi antenna system 42. In the return loss X-Y plot of FIG. 10, the X-axis represents the frequency of the return loss of the GPS signal S1 and the return loss of the BT/Wi-Fi signal S2, and the Y-axis represents the signal strength of the return loss of the GPS signal S1 and the return loss of the BT/Wi-Fi signal S2. From the return loss X-Y plot of FIG. 10, it is clearly seen that the strength of the return loss of the GPS signal S1 is −13.9 dB at the frequency of 1.575 GHz; the strength of the return loss of the BT/Wi-Fi signal S2 is −12 dB at the frequency of 2.4 GHz, and the strength of S2 falls into the range of −5 dB to −10 dB when the frequency is within the range of 5 GHz to 5.8 GHz. Therefore, as for GPS, the wireless transmission system 4 according to the first embodiment of the present invention can support a GPS communication frequency of 1.575 GHz; for BT, the wireless transmission system 4 can support a BT communication frequency of 2.4 GHz; and for Wi-Fi, the wireless transmission system 4 can support a communication frequency of 2.4 GHz and 5 GHz. On the other hand, it can also be concluded from the return loss X-Y plot of FIG. 10 that the return loss of the GPS signal S1 of the GPS antenna system 41 and the return loss of the BT/Wi-Fi signal S2 of the BT/Wi-Fi antenna system 42 do not interfere with each other. When the return loss of the GPS signal S1 is at its maximum value (e.g. at 1.575 GHz on the X-axis), the return loss of the BT/Wi-Fi signal S2 is at its minimum value; on the contrary, when the return loss of the BT/Wi-Fi signal S2 is at its maximum value (e.g. at 2.4 GHz on the X-axis), the return loss of the GPS signal S1 is at its minimum value. Hence, for the wireless transmission system 4 according to the first embodiment of the present invention, the signals of the GPS antenna system 41 and the BT/Wi-Fi antenna system 42 do not interfere with each other when both systems are in working mode, and the signals of both systems are in their optimal conditions.

Figure 11:
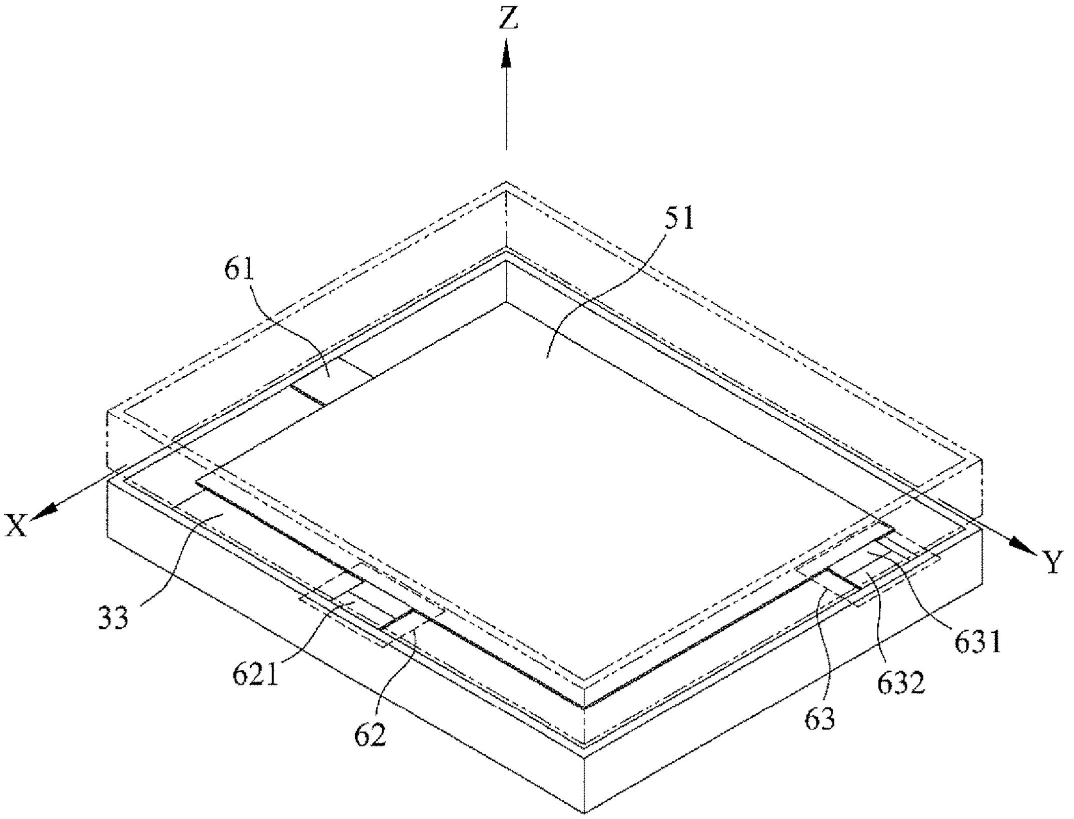
FIG. 11 is a perspective view showing the wireless transmission structure with a back cover according to the first embodiment of the present invention.
Figure 12:
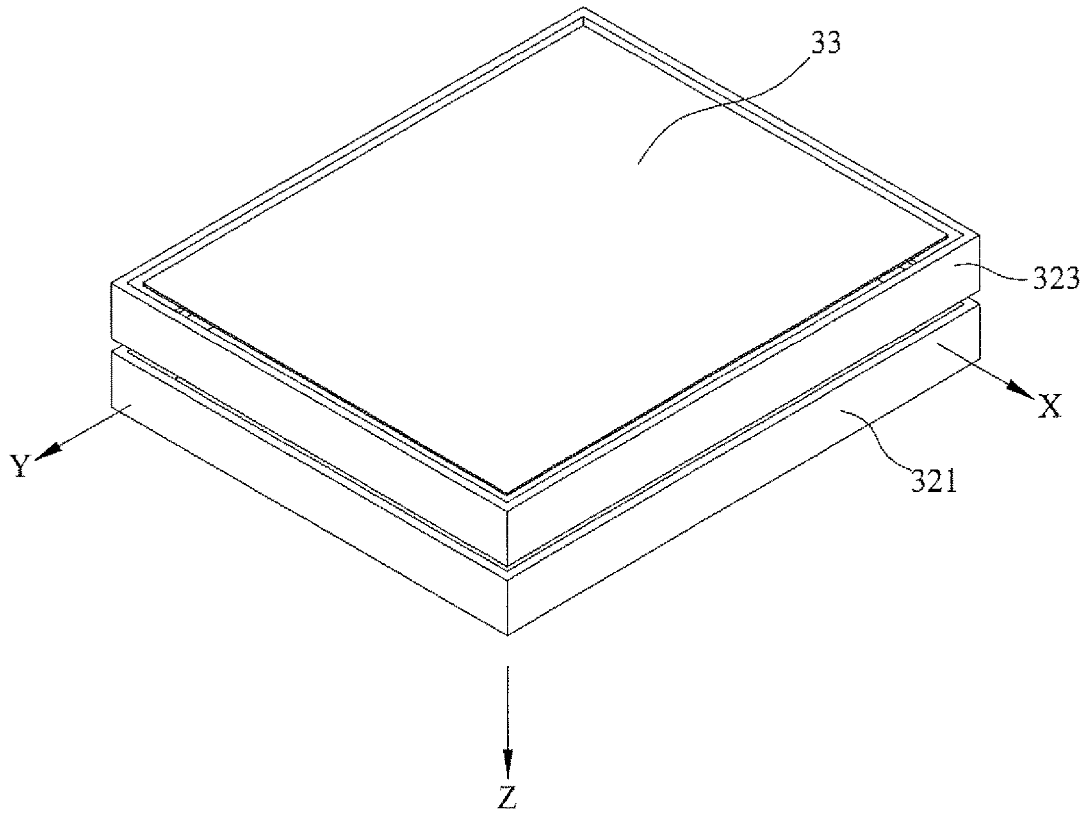
FIG. 12 is another perspective view showing the wireless transmission structure with the back cover according to the first embodiment of the present invention.

FIG. 11 is a perspective view showing the wireless transmission structure with a back cover according to the first embodiment of the present invention, and FIG. 12 is another perspective view showing the wireless transmission structure with the back cover according to the first embodiment of the present invention. As shown in FIG. 3, FIG. 8, FIG. 11 and FIG. 12, in the first embodiment of the present invention, the frame structure 35 (wireless transmission structure) is assembled with the back cover 33 to form the housing 36 of the wearable device 3. In addition, since a plastic layer (not shown) is disposed between the connection of the back cover 33 and the frame structure 35, the back cover 33 and the frame structure 35 are always electrically insulated from each other regardless of the material of the back cover 33. Therefore, the antenna gain of the wireless transmission structure is not impaired.

Although the operation of the method according to the embodiments of the present invention has been described in a certain order, it is not meant to limit the order of the steps. It should be apparent to those skilled in the art that the method can also be performed in a different order. Therefore, the order of the steps should not be seen as a limitation to the claims of the present invention. In addition, the method in the claims should not be limited by the order of steps described above. Those who are skilled in the art should understand that the order of the steps can be changed without departing from the scope of the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A wearable device with wireless transmission, comprising:

a first exterior member configured to operate at a first frequency band; a second exterior member configured to operate at a second frequency band; and a connecting member configured to electrically insulate the first exterior member from the second exterior member, so the wearable device is able to operate at the first frequency band and the second frequency band simultaneously; wherein a frame structure of the wearable device is formed by stacking the first exterior member, the connecting member and the second exterior member in sequence from top to bottom; and a first feed point is located at a first edge of the first exterior member, a second feed point is located at a second edge of the second exterior member, and a ground point is located at a third edge of the second exterior member opposite to the first edge, wherein the second edge is between the first and third edges.

2. The wearable device with wireless transmission according to claim 1 further comprising a back cover, wherein the back cover is fastened to the connecting member via at least one fastening element, and a housing is formed by the frame structure and the back cover.

3. The wearable device with wireless transmission according to claim 1 further comprising a metal layer having a ground plane, wherein the metal layer is printed on a printed circuit board or is independently disposed on a surface of the printed circuit board, and the metal layer is electrically connected to the first exterior member and the second exterior layer.

4. The wearable device with wireless transmission according to claim 3, wherein when the metal layer is printed on the printed circuit board, the printed circuit board and the metal layer are both configured to be the ground plane.

5. The wearable device with wireless transmission according to claim 3, wherein when the metal layer is independently disposed on the surface of the printed circuit board, the metal layer can be disposed on an upper surface or a lower surface of the printed circuit board, and the metal layer is electrically connected to the printed circuit board.

6. The wearable device with wireless transmission according to claim 3, wherein the printed circuit board further comprises:

a first chip module connected to a processor, wherein the first chip module enables the wearable device to operate at the first frequency band via the first exterior member; and a second chip module connected to the processor, wherein the second chip module enables the wearable device to operate at the second frequency band via the second exterior member.

7. The wearable device with wireless transmission according to claim 1, wherein a distance between the first exterior member and the second exterior member in a third direction (a Z-axis direction) is less than 1 mm.

8. The wearable device with wireless transmission according to claim 3, wherein the first exterior member is located above the metal layer and the second exterior member is located beneath the metal layer; alternatively, the first exterior member is located beneath the metal layer and the second exterior member is located above the metal layer.

9. The wearable device with wireless transmission according to claim 3, wherein the first exterior member includes at least one first connecting point, and the second exterior member includes a plurality of second connecting points; the first exterior member is electrically connected to the ground plane via the at least one first connecting point, and the second exterior member is electrically connected to the ground plane via the plurality of second connecting points.

10. The wearable device with wireless transmission according to claim 9, wherein one of the first connecting points or the second connecting points includes at least one adjustable element for adjusting a return loss of the first frequency band and/or the second frequency band.

11. The wearable device with wireless transmission according to claim 10, wherein the first connecting points and the second connecting points include a plurality of feed points and a ground point.

12. The wearable device with wireless transmission according to claim 11, wherein one of the feed points and the ground point include the adjustable element.

13. The wearable device with wireless transmission according to claim 10, wherein the adjustable element is a variable capacitor or a variable inductor.

14. The wearable device with wireless transmission according to claim 3, wherein an antenna structure of the wearable device is formed by the first exterior member, the second exterior member and the metal layer.

15. The wearable device with wireless transmission according to claim 1 further comprising a display module and a battery, wherein the display module and the battery are supported by the metal layer.

16. The wearable device with wireless transmission according to claim 15, wherein the display module is a module with touch function.

17. The wearable device with wireless transmission according to claim 1, wherein the metal layer, the first exterior layer and the second exterior layer are made of a conductor, which is one of the following: stainless steel, magnesium aluminum alloy, copper alloy, aluminum copper alloy or other metals with a good conductivity.

18. The wearable device with wireless transmission according to claim 2, wherein the back cover is a conductor or a nonconductor.

19. The wearable device with wireless transmission according to claim 18, wherein when the back cover is the conductor, a plastic layer is disposed on the cover to electrically insulate the back cover from the second exterior member.

20. The wearable device with wireless transmission according to claim 18, wherein the nonconductor is one of the following: acrylic, PET, resin or other plastic materials.

21. The wearable device with wireless transmission according to claim 19, wherein the plastic layer is an annular structure.

22. A manufacturing method of a wearable device with wireless transmission, comprising the following steps: processing a first exterior member and a second exterior member so as to operate at different frequency bands and form outer appearances thereof; forming a connecting member with plastic injection molding process, and connecting the first exterior member and the second exterior member with the connecting member to form a frame structure; embedding a metal layer inside the frame structure with insert molding process, wherein the first exterior member is electrically insulated from the second exterior member by the connecting member; and providing a back cover, integrating the back cover with the frame structure to form a housing of the wearable device; and a first feed point is located at a first edge of the first exterior member, a second feed point is located at a second edge of the second exterior member, and a ground point is located at a third edge of the second exterior member opposite to the first edge, wherein the second edge is between the first and third edges.

* * * * *